(12) United States Patent
Luick et al.

(10) Patent No.: US 6,868,033 B2
(45) Date of Patent: Mar. 15, 2005

(54) DUAL ARRAY READ PORT FUNCTIONALITY FROM A ONE PORT SRAM

(75) Inventors: David A. Luick, Rochester, MN (US); Anthony G. Aipperspach, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/201,507

(22) Filed: Jul. 23, 2002

(65) Prior Publication Data

US 2004/0017727 A1 Jan. 29, 2004

(51) Int. Cl.[7] .............................................. G11C 8/00
(52) U.S. Cl. ................................. 365/230.05; 156/190
(58) Field of Search .................... 365/230.05, 190, 365/154, 156, 49, 189.01, 189.03, 189.04, 202; 711/3, 128, 125, 108, 145, 152

(56) References Cited

U.S. PATENT DOCUMENTS 4,802,122 A * 1/1989 Auvinen et al. ............ 365/154
5,644,547 A * 7/1997 Grishakov et al. ..... 365/230.05
6,189,068 B1 * 2/2001 Witt et al. ...................... 711/3
6,272,596 B1 * 8/2001 Nishimukai et al. ........ 711/128

* cited by examiner

Primary Examiner—Gene N. Aududuong
(74) Attorney, Agent, or Firm—Arnall Golden Gregory LLP

(57) ABSTRACT

A storage cell includes a bit storage member capable of storing a data bit. The bit storage member includes a true data output, having a true data value corresponding to the data bit, and a complement data output, having a complement data value corresponding to a logical complement of the true data value. A first controllable gate is electronically coupled to the true data output and is responsive to a first read enable signal so that the true data value is passed through the first controllable gate when the first read enable signal is asserted. A second controllable gate is electronically coupled to the complement data output and is responsive to a second read enable signal so that the complement data value is passed through the second controllable gate when the second read enable signal is asserted.

9 Claims, 2 Drawing Sheets

DUAL ARRAY READ PORT FUNCTIONALITY FROM A ONE PORT SRAM

BACKGROUND OF THE INVENTION

1. Field of the Invention

The present invention relates to solid state devices and, more specifically, to a static random access memory having dual read port functionality.

2. Description of the Prior Art

One of the most important components in a computer is the memory. Every time a computer is started up, programs are loaded into memory. The memory into which these programs are loaded is called RAM, an acronym for Random Access Memory. It is from the RAM that most programs perform their functions and operate to give the user the required results. Most RAM memory is housed in chips or integrated circuits (IC's). There are several types of RAM. The two most common types are DRAM and SRAM.

A typical CMOS (complementary metal oxide silicon) SRAM cell (i.e., a memory unit that stores a single bit of data) has an inherent structure that generates a data output and a complement output. These outputs can have only one of two values: a "0" or a "1." The complement output is a value that is opposite the data output. For example, if the data output is a "1" then the complement output is a "0," similarly, if the data output is a "0" then the complement output is a "1."

Many computers employ a cache to store instructions immediately prior to their execution by the computer's processor. A cache typically includes an SRAM that receives computer instructions from a slower memory and stores the instructions for subsequent use by the processor. When an instruction is passed from the cache to the processor, the processor is said to execute a load from the cache.

High capacity computer processors with a relatively wide instruction issue width (e.g., 4–78 issue) are required to execute two or more load instructions per cycle. In general, this requires either two copies of an L1 cache (using one read per copy) or a two-port cache array implementation. Either case can introduce from 1.7 to 2 times the array area of a one-port cache design. Furthermore, two copies of the array will consume twice the store power of a single array, while a two-port array will slow down operation of the system because of the larger overall area requirement.

For performing writes, existing SRAM cells generally require both a true data line and a complement data line. Both lines are subsequently readable. However, only the true line is read, while the complement line goes unused.

Therefore, there is a need for a cache array that provides two read ports, while adding only a small cost in area, power and performance.

SUMMARY OF THE INVENTION

The disadvantages of the prior art are overcome by the present invention which, in one aspect, is a storage cell that includes a bit storage member capable of storing a data bit. The bit storage member includes a true data output, having a true data value corresponding to the data bit, and a complement data output, having a complement data value corresponding to a logical complement of the true data value. A first controllable gate is electronically coupled to the true data output and is responsive to a first read enable signal so that the true data value is passed through the first controllable gate when the first read enable signal is asserted. A second controllable gate is electronically coupled to the complement data output and is responsive to a second read enable signal so that the complement data value is passed through the second controllable gate when the second read enable signal is asserted.

In another aspect, the invention is a computational circuit that includes an array of storage cells, a port selector, an inverting element and a true/complement selector. In the array of storage cells, each storage cell capable of storing a different bit of data. Each cell is also capable of generating a true value corresponding to the bit of data and a complement value that is a logical complement of the true value. The storage cells are arranged in a plurality of columns and rows so that each storage cell in a common row can be addressed simultaneously by a common write line. Also, each true value of each storage cell in a column is in data communication with a column-specific true data line. Each complement value of each storage cell in a column is in data communication with a column-specific complement data line. Each column-specific true data line corresponds to a separate bit of a first read port. Each storage cell includes a true data read gate that selectively allows the true value to be gated onto the corresponding true data line of the first read port. Each column-specific complement data line corresponds to a separate bit of a second read port. Each storage cell also includes a complement data read gate that selectively allows the complement value to be gated onto the corresponding complement data line of the second read port. The port selector is responsive to a first control line and is in data communication with both the first read port and the second read port. The port selector transmits data from the first read port when the first control line is not asserted and transmits data from the second read port when the first control line is asserted. The inverting element is in data communication with the port selector and generates a logical complement of data transmitted by the port selector. The true/complement selector is responsive to a second control line and is in data communication with both the port selector and the inverting element. The true/complement selector transmits uncomplemented data from the port selector when the second control line is not asserted and transmits complemented data from the port selector when the second control line is asserted.

In yet another aspect, the invention is a method of using data from a bit storage cell that has a true output and a complement output. The true output is selectively gated to a first data port and the complement output is selectively gated to a second data port.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1A:
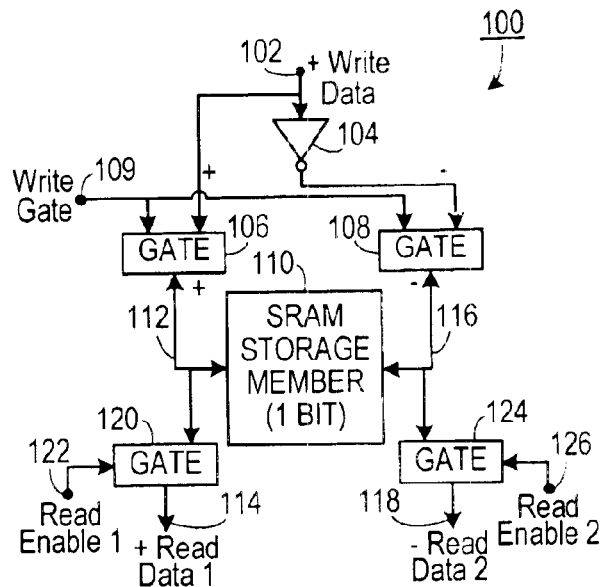
FIG. 1A is a block diagram of a first embodiment of the invention.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

As shown in FIG. 1A, one illustrative embodiment of the invention is a storage cell 100 having a single write port 102 and two read ports: a true data read port 114 and a complement data read port 118. Data from the write port 102 is fed into an inverter 104 so that all data is written as a true value and a complement value simultaneously. The true data is coupled to a first write gate 106 and the complemented data is coupled to a second write gate 108. Both the first write gate 106 and the second write gate 108 are enabled by a write gate enable signal 109 that is asserted whenever data is to be written to the storage cell 100.

Data is written to and read from a storage member 110 (which is typically an SRAM cell, but may be any type of data storage cell that inherently generates a true and a complement data value). The storage member 110 has an inherent true data line 112 and an inherent complement data line 116. The true data line 112 is coupled to a first read gate 120 that is enabled by a first read enable signal 122 and the complement data line 116 is coupled to a second read gate 124 that is enabled by a second read enable signal 126. The first read enable signal 122 and the second read enable signal 126 are independently controllable. Therefore, data from the first read port 114 and the second read port 118 may be used independently of each other.

Figure 1B:
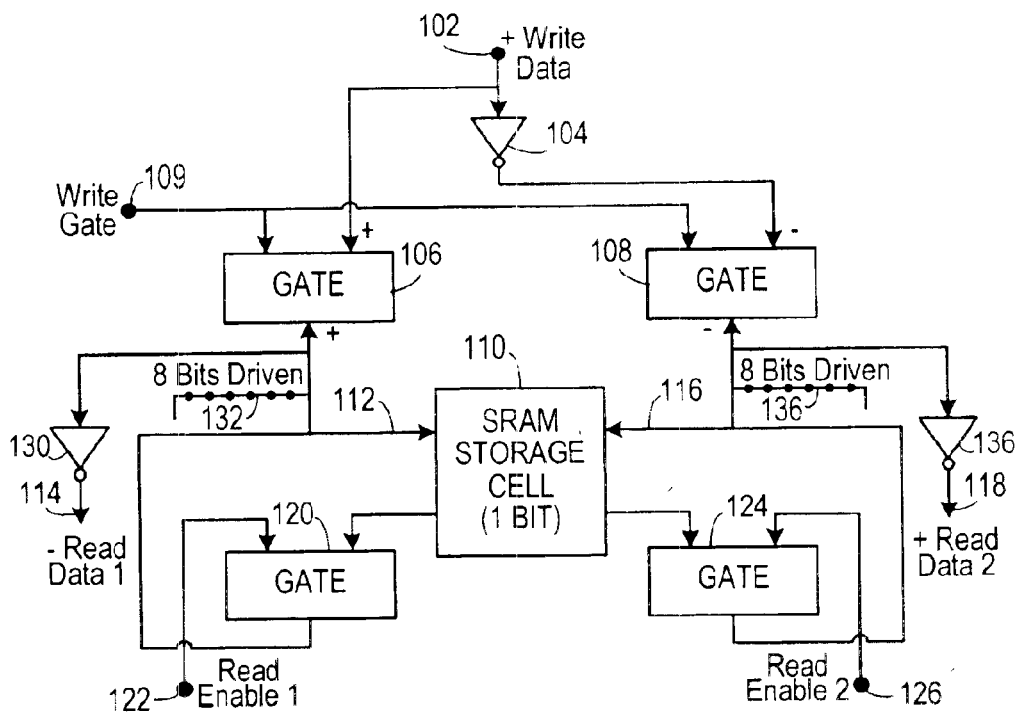
FIG. 1B is a block diagram of a second embodiment of the invention.

A slightly more complex embodiment of the invention is shown in FIG. 1B, in which data from the true data line 112 is dotted 132 to several subsequent logic devices and data from the complement data line 116 is also dotted 136 to several subsequent logic devices. The data from the true data line 112 is also delivered to a first inverter 130, thereby generating an inverted output that is delivered to the first read port 114. Similarly, the data from the complement data line 116 is delivered to a second inverter 136, thereby generating true data (a complement of the already complemented data) that is delivered to the second read port 118.

Figure 2:
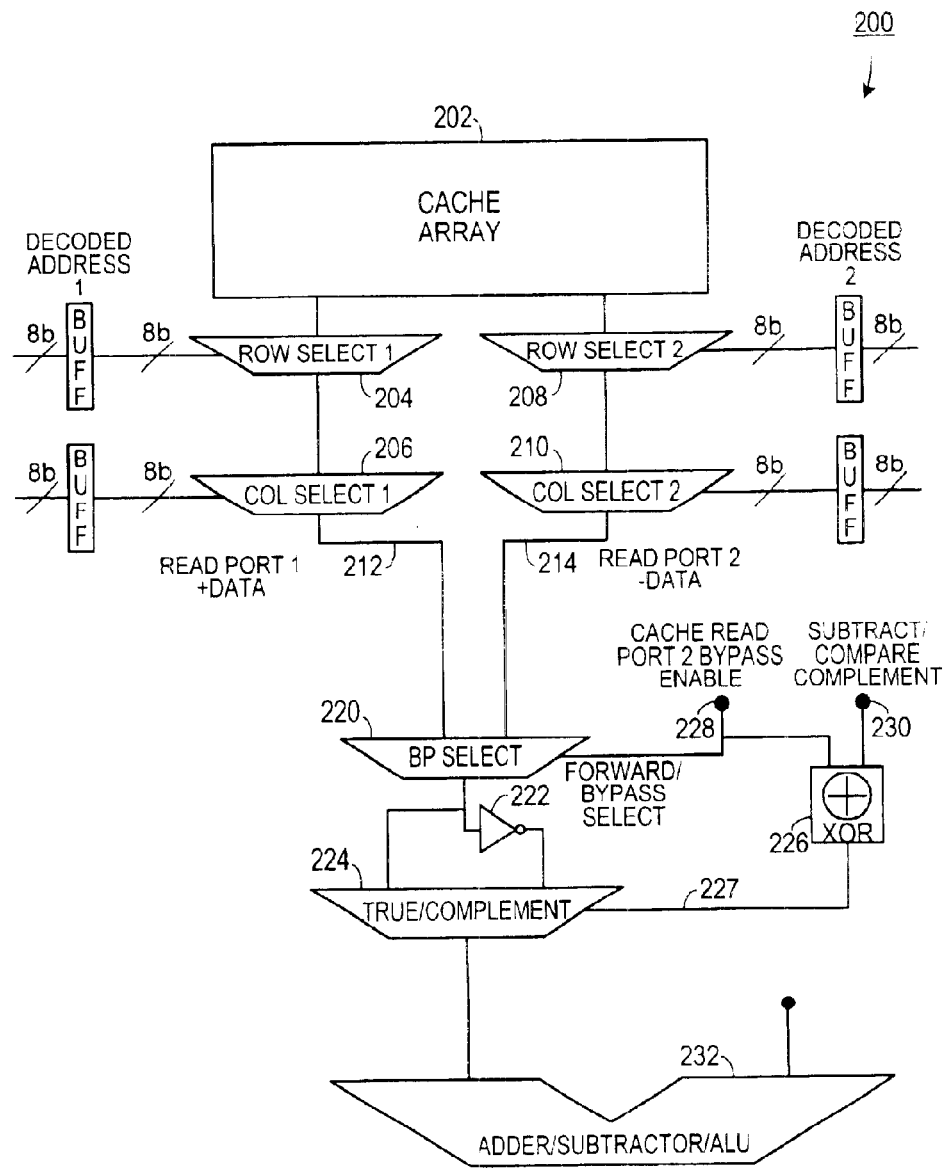
FIG. 2 is a block diagram of a third embodiment of the invention.

The 2 read port/1 write port storage cell 100 has the artifact that when performing two read accesses, one read access returns negative read data 114 and the other read access returns positive read data 118. This complementary output requirement can be mitigated from a delay standpoint using a computational circuit 200, as shown in FIG. 2. The computational circuit 200 employs an array 202 of dual read port storage cells and data from the array 202 is selected by a first row selector 204 or a second row selector 208, as well as a first column selector 206 or a second column selector 210.

Data from the first read port 212, which is true data, and from the second read port 214, which is complement data, is routed to a port selector 220, which is controlled by a first control line 228. The data from the port selector 220 is routed to an inverter 222 and a true/complement selector 224, which selects either true data from the port selector 220 or complemented data from the inverter 222 and transmits it to a computational device, such as an ALU 232.

The true/complement selector 224 is controlled by a second control line 227, which may be coupled to an XOR gate 226 that is responsive to both the first control line 228 and a subtract control line 230. The XOR gate 226 is configured so that the second control 227 line is asserted when the subtract control line 230 is asserted and the first control line 228 is not asserted or when the subtract control line 230 is not asserted and the first control line is asserted 228. Thus, when a subtract is to be performed, if true data from the first read port 212 is used, then the complemented true data from inverter 222 is selected. On the other hand, if the complemented data from the second read port 214 is transmitted to the ALU 232, then the already complemented data directly from the port selector 220 is transmitted to the ALU 232. If an addition is to be performed, then the true data from the first read port 212 is passed through unchanged, while the complemented data from the second read port 214 is complemented again and then passed to the ALU 232.

The most critical delay occurs from forwarding data directly to the ALU 232 input via the port selector 220 (which may also be referred to as a "bypass selector"). However, because the data must perform subtractions and compares as well as addition, the true/complement selector 224 is required prior to delivery of the data to the ALU 232. Some RISC architectures require the true/complement functionality on both ALU inputs.

However, if the second read port 214 data is being fetched and needs to be forwarded and bypassed to an ALU input, its data is already complemented (1's complement) from what is desired in the case of an ALU addition or logical function. On the other hand, if a subtraction were to be done, the data complement has already occurred and data from the second read port 214 is selected directly. Thus, the simple and delay-free solution is to simply reverse the true/complement functionality for all ALU functions bypassing the second read port 214 by using the XOR 226 function, XOR'ing the first control line 228 with the subtract control line 230, so that true (uncomplemented) data becomes complement and complemented data becomes true for the second read port 214 data only. Since it is known whether second read port 214 is bypassed to the ALU 232 input one or more cycles before the fetch data arrives, the extra XOR gate 226 in the control path does not affect the critical path which is the fetched data itself. Since all the bypass and true/complement logic is required anyway, no extra silicon area cost is involved.

The other major interface to the cache array 202 and individual cells is the decoded address of the word (or bit) desired. A 1-port array can use the same decoded address lines or select lines (also called word lines) for fetches and stores into the array 202. Some high-performance processors bank a 1-port array into two or more pieces, also called interleaving and have separate address decoders for each bank.

In the example shown in FIG. 2, it is assumed that two pre-decoded addresses, one for each read port, is available from a special unary adder for generating pre-decoded row and column addresses. The advantage of this type of effective address adder implementation is that it is faster than a binary adder and naturally produces the decoded row and column selects for the array. Thus, the only real addressing area cost for driving a second port is that of a second set of address pre-power buffers and any extra area due to the second address copy wiring. However, the array is silicon limited, not wire limited, so that adding a couple dozen address and control signals does not increase the area required.

Even though FIG. 2 shows two complete sets of row and column read port selectors 204 and 206, and 208 and 210, this requirement for twice the number of read selectors can also be avoided. This is because most RISC architectures have two register sizes and corresponding load (fetch) sizes used to load then. In general, a 32 bit word/register size architecture was defined, and a 64 bit doubleword/register size architecture was added later. Since registers primarily contain addresses, and the base register size of 32 bit usually the 64 bit cases, it follows that the most common case is when two simultaneous independent loads each fetch two 32 bit words. The probability of a 64 bit load fetch in most cases is about one tenth that of a 32 bit load fetch so that the probability of a pair of 64 bit load fetches is on the order of 1% that of 32 bit load fetches. Thus, the two array read ports 212 and 214, as shown in FIG. 2, can each be configured for a 32 bit (word only) fetch port to allow two independent word fetches per cycle, but which are ganged and used in tandem to fetch a single 64 bit doubleword value when required. This implementation would likely cover 99% of the execution frequency for load pairs.

The above described embodiments are given as illustrative examples only. It will be readily appreciated that many deviations may be made from the specific embodiments disclosed in this specification without departing from the invention. Accordingly, the scope of the invention is to be determined by the claims below rather than being limited to the specifically described embodiments above.

What is claimed is:

1. A storage cell, comprising:
   a. a bit storage member capable of storing a data bit and including a true data output, having a true data value corresponding to the data bit, and a complement data output, having a complement data value corresponding to a logical complement of the true data value;
   b. a first controllable gate electronically coupled to the true data output, the first controllable gate responsive to a first read enable signal so that the true data value is passed through the first controllable gate to a first read port when the first read enable signal is asserted; and
   c. a second controllable gate electronically coupled to the complement data output, the second controllable gate responsive to a second read enable signal, different from the first read enable signal, so that the complement data value is passed through the second controllable gate to a second read port, different from the first read port, when the second read enable signal is asserted, whereby the complement data value may be accessed independently from the true data value.

2. The storage cell of claim 1, further comprising:
   a. a write data input, upon which a write data value may be transmitted to the bit storage member; and
   b. an inverter, coupled to the write data input, that generates a logical value that is a complement of the write data value, the inverter in data communication with the bit storage member.

3. The storage cell of claim 1, further comprising:
   a. a first write gate, that is enabled by a write line, that gates data from the write data input to the bit storage member; and
   b. a second write gate, that is enabled by the write line, that gates data from inverter to the bit storage member, so that when the write line is asserted, the data value will be stored in the bit storage member.

4. A computational circuit, comprising:
   a. an array of storage cells, each storage cell capable of storing a different bit of data and each cell capable of generating a true value corresponding to the bit of data and each cell capable of generating a complement value that is a logical complement of the true value, the storage cells arranged in a plurality of columns and rows so that each storage cell in a common row can be addressed simultaneously by a common write line and so that each true value of each storage cell in a column is in data communication with a column-specific true data line and so that each complement value of each storage cell in a column is in data communication with a column-specific complement data line, each column-specific true data line corresponding to a separate bit of a first read port wherein each storage cell includes a true data read gate that selectively allows the true value to be gated onto the corresponding true data line of the first read port, and each column-specific complement data line corresponding to a separate bit of a second read port, different from the first read port, wherein each storage cell includes a complement data read gate that selectively allows the complement value to be gated onto the corresponding complement data line of the second read port;
   b. a port selector, responsive to a first control line, that is in data communication with both the first read port and the second read port, that transmits true data from the first read port when the first control line is not asserted and that transmits complement data from the second read port when the first control line is asserted;
   c. an inverting element in data communication with the port selector that generates a logical complement of data transmitted by the port selector; and
   d. a true/complement selector, responsive to a second control line and in data communication with the port selector and the inverting element, that transmits uncomplemented data from the port selector when the second control line is not asserted and that transmits complemented data from the port selector when the second control line is asserted.

5. The computational circuit of claim 4, further comprising an XOR gate in data communication with the both the first control line and a subtract control line, that generates a control output to the second control line, so that the second control line is asserted when the subtract control line is asserted and the first control line is not asserted or when the subtract control line is not asserted and the first control line is asserted.

6. The computational circuit of claim 4, further comprising an XOR gate in data communication with the both the first control line and a subtract control line, that generates a control output to the second control line, so that the second control line is asserted when the subtract control line is asserted and the first control line is not asserted or when the subtract control line is not asserted and the first control line is asserted.

7. A method of using data from a bit storage cell that has a true output and a complement output, comprising the steps of:
   a. selectively gating the true output to a first data port; and
   b. selectively gating the complement output to a second data port, different from the first data port.

8. The method of claim 7, further comprising the step of determining how the true data from the first data port is to be used and gating the data from the first data port to a complementing circuit if the data from the first data port is to be used in a subtraction.

9. The method of claim 7, further comprising the step of determining how the complement data from the second data port is to be used and gating the data from the second data port to a complementing circuit if the data from the first data port is to be used in an addition.

* * * * *